(12) United States Patent
Harter et al.

(10) Patent No.: US 10,085,113 B1
(45) Date of Patent: Sep. 25, 2018

(54) METHODS AND SYSTEMS FOR DETERMINING POSITIONING INFORMATION FOR DRIVER COMPLIANCE

(71) Applicant: J. J. Keller & Associates, Inc., Neenah, WI (US)

(72) Inventors: Thomas C. Harter, Neenah, WI (US); Michael K. Kuphal, Greenville, WI (US); Bruce D. Lightner, La Jolla, CA (US)

(73) Assignee: J. J. Keller & Associates, Inc., Neenah, WI (US)

( * ) Notice: Subject to any disclaimer, the term of this patent is extended or adjusted under 35 U.S.C. 154(b) by 0 days.

(21) Appl. No.: 15/470,432

(22) Filed: Mar. 27, 2017

(51) Int. Cl.
*H04W 4/02* (2018.01)
*G07C 5/02* (2006.01)
*G07C 5/00* (2006.01)
*G07C 5/08* (2006.01)

(52) U.S. Cl.
CPC .............. *H04W 4/02* (2013.01); *G07C 5/008* (2013.01); *G07C 5/02* (2013.01); *G07C 5/0841* (2013.01)

(58) Field of Classification Search
CPC ......... G05C 5/02; G05C 5/0841; B61L 27/04; B60W 40/09; H04M 1/72577; G06Q 30/0611; G06Q 20/405; G06Q 10/06; G07C 5/008; G08G 1/0112; H04W 4/02
See application file for complete search history.

(56) References Cited

U.S. PATENT DOCUMENTS

| | | | |
|---|---|---|---|
| 7,474,897 B2 | 1/2009 | Morgan et al. | |
| 7,493,127 B2 | 2/2009 | Morgan et al. | |
| 8,140,094 B2 | 3/2012 | Morgan et al. | |
| 8,244,272 B2 | 8/2012 | Morgan et al. | |
| 8,676,442 B2 * | 3/2014 | Lynar ................... | G08G 1/0112 701/41 |
| 8,718,592 B2 * | 5/2014 | Annamalai ............. | H04W 4/02 455/404.1 |
| 9,691,091 B2 * | 6/2017 | Jones ................. | G06Q 30/0611 |
| 2007/0004427 A1 | 1/2007 | Morgan et al. | |
| 2010/0004997 A1 | 1/2010 | Mehta et al. | |
| 2012/0166018 A1 * | 6/2012 | Larschan ............... | G07C 5/008 701/1 |

(Continued)

*Primary Examiner* — Yuri Kan
(74) *Attorney, Agent, or Firm* — Michael Best & Friedrich LLP

(57) ABSTRACT

A method and apparatus for determining positioning information for driver compliance. The apparatus comprising a an electronic processor connected to an electronic control unit and a transceiver and configured to receive the vehicle data from the electronic control unit, determine whether the apparatus includes a local source of positioning information, determine whether a positioning information from the local source of positioning information meets or exceeds an accuracy threshold and an availability threshold, if the apparatus includes the local source of positioning information, and send a request to the portable communication device for additional positioning information if the apparatus does not include the local source of positioning information, or the positioning information from the local source of positioning information does not meet or exceed the accuracy threshold, the availability threshold, or both.

15 Claims, 7 Drawing Sheets

(56) References Cited

U.S. PATENT DOCUMENTS

| | | | |
|---|---|---|---|
| 2013/0080454 A1* | 3/2013 | Raghunathan | G06Q 10/06 |
| | | | 707/754 |
| 2014/0226502 A1 | 8/2014 | Behnamfar et al. | |
| 2015/0072714 A1 | 3/2015 | Froehlich et al. | |
| 2016/0127871 A1 | 5/2016 | Smith et al. | |
| 2016/0247153 A1* | 8/2016 | Lesesky | G06Q 20/405 |
| 2017/0067385 A1* | 3/2017 | Hunt | B60W 40/09 |
| 2017/0183015 A1* | 6/2017 | Phelan | B60W 40/09 |
| 2017/0279957 A1* | 9/2017 | Abramson et al. | |
| | | | H04M 1/72577 |
| 2018/0057030 A1* | 3/2018 | Puttagunta | B61L 27/04 |

\* cited by examiner

METHODS AND SYSTEMS FOR DETERMINING POSITIONING INFORMATION FOR DRIVER COMPLIANCE

BACKGROUND

Embodiments relate to methods and systems for determining positional information for logging and managing data for complying with requirements governing the operation of commercial motor vehicles.

SUMMARY

One embodiment provides an apparatus for determining positioning information for driver compliance. The apparatus includes a connector for physically coupling the apparatus to a diagnostic port in a vehicle. The apparatus also includes an electronic control unit connected to the connector and configured to receive vehicle data. The apparatus also includes a transceiver for communicating with a portable communication device. The apparatus also includes an electronic processor connected to the electronic control unit and to the transceiver and configured to receive the vehicle data from the electronic control unit, determine whether the apparatus includes a local source of positioning information, determine whether a positioning information from the local source of positioning information meets or exceeds an accuracy threshold and an availability threshold, if the apparatus includes the local source of positioning information, and send a request to the portable communication device for additional positioning information if the apparatus does not include the local source of positioning information, or the positioning information from the local source of positioning information does not meet or exceed the accuracy threshold, the availability threshold, or both.

Another embodiment provides a method receiving, with an electronic processor, vehicle data from a diagnostic port in a vehicle; determining, with the electronic processor, whether a base unit includes a local source of positioning information; determining whether a positioning information from the local source of positioning information meets or exceeds an accuracy threshold and an availability threshold if the base unit includes the local source of positioning information; and sending a request to a portable communication device for additional positioning information if the base unit does not include the local source of positioning information, or the positioning information from the local source of positioning information does not meet or exceed the accuracy threshold, the availability threshold, or both.

In one embodiment, when the accuracy and/or the availability of the positioning information available at a base unit is beyond a required threshold (for example, a base unit associated with a commercial motor vehicle) then positioning information from a portable communication device may be used based on whether the portable communication device (for example, a mobile device) provides a more accurate reading. Often the global positioning system (GPS) antenna associated with the portable communication device is located in a better location to receive GPS satellite data compared to the GPS antenna located in the base unit, which is typically located near the in-cab diagnostic port.

In one embodiment, when positioning information is needed for tagging hours-of-service (HOS) compliance events, the portable communication device requests position information from the base unit. If the positioning information meets a desired accuracy and availability requirements, it is used for tagging in the HOS compliance event. Otherwise, positioning information is obtained from the portable communication device and used for tagging in the HOS compliance event.

In another embodiment, the portable communication device continually provides its positioning information to the base unit and the base unit uses a combination of its measurements and the portable communication device's measurements to generate positioning information with equal or better accuracy and availability. For example, generate positioning information could be a weighted average based on each location measurement's calculated precision.

In yet another embodiment, when there is no positioning information available in the base unit, the base unit is configured to continuously receive positioning information from a portable communication device that is used for tagging HOS compliance events.

In some embodiments, multiple sources external to the base unit may be used to provide positioning information. For example, a positioning signal from a Global Positioning System (GPS) receiver, a cell tower, or a Wi-Fi source may be used to provide additional positioning information that may be used for tagging HOS compliance events.

Thus, using embodiments provided herein, the positioning information of a commercial motor vehicle (CMV) is determined. Other aspects of various embodiments will become apparent by consideration of the detailed description and accompanying drawings.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
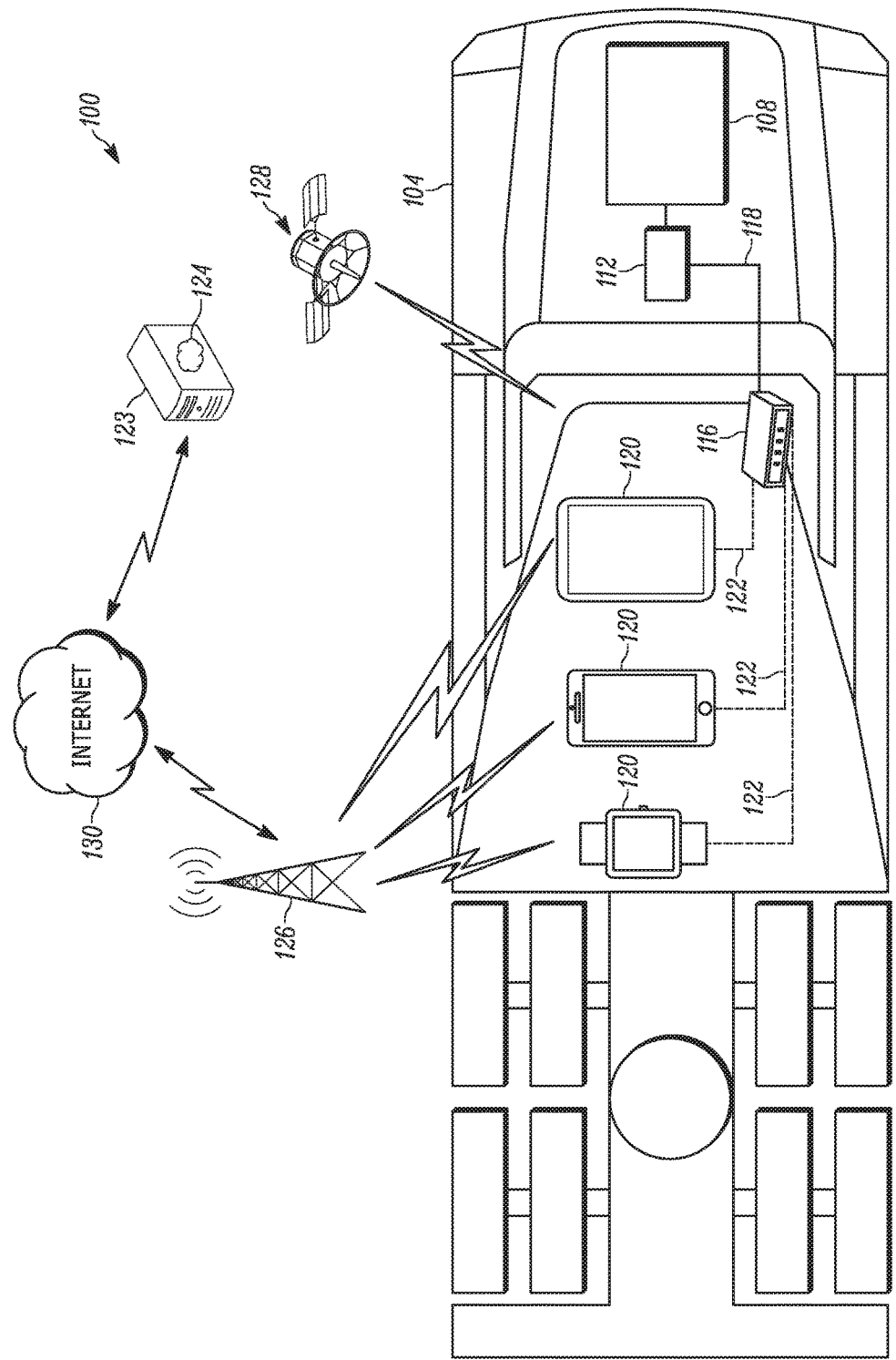
FIG. 1 schematically illustrates a driver performance monitoring system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Electronic logging devices (ELD) (for example, a base unit) may contain hardware, software, and other components that are used to determine the position of commercial motor vehicle (CMV). ELDs are subject to particular accuracy and availability requirements mandated by the Federal Motor Carrier Safety Administration (FMCSA). The accuracy requirements include having +/−0.5 miles absolute position of the commercial motor vehicle. The availability requirement includes detecting the commercial motor vehicle once for every 5 miles of driving.

FIG. 1 illustrates a performance monitoring system 100 for use with a vehicle 104. Although the vehicle 104 is illustrated as a commercial vehicle in the form of a tractor configured to tow a trailer (not shown), the performance monitoring system 100 can also be implemented in or otherwise used in connection with other types of vehicles, such as construction vehicles, agricultural equipment, and passenger vehicles. The vehicle 104 includes an engine 108 that drives the vehicle 104. The engine 108 is controlled by an electronic control unit (ECU) 112. The ECU 112 monitors operating parameters of the vehicle 104 and controls the engine 108 and other parts of the vehicle 104 based on the monitored parameters. Operating parameters monitored by the ECU 112 include speed, hours of engine operation, operating status, ignition state, trip distance, total vehicle distance, and the like.

In one embodiment, the performance monitoring system 100 includes an electronic on-board recorder ("EOBR") base unit 116, one or more portable communication devices 120 (that are external to the base unit 116), and a remote server 123 running a host application 124. In the example illustrated in FIG. 1, the base unit 116 communicates with the ECU 112 through a data bus 118. The data bus 118 can conform to communication standards such as Society of Automotive Engineers (SAE) standard J1939, SAE J1708, or other standards. The base unit 116 also communicates with the portable communication devices 120 through a wired or wireless link 122. For example, in some embodiments, the base unit 116 communicates with the portable communication devices 120 using short-wave radio transmissions in the Industrial, Scientific and medical (ISM) radio band from 2400 to 2486 MHz (commonly referred to as Bluetooth or the Institute of Electrical and Electronics Engineers (IEEE) 802.15.1 standard).

The portable communication device 120 may be a smart phone, a tablet computer, a laptop computer, a smart watch, or another computing device upon which software can be readily run, that can wirelessly connect to other devices, and that can be carried and moved by a user. In the example illustrated in FIG. 1, the portable communication device 120 wirelessly communicates with the remote server 123 over a communication network 130 using a cellular network connection with a cellular tower 126 or the Internet (for example, using a Wi-Fi connection).

The base unit 116 performs a plurality of functions including, for example, time keeping and data logging. In one implementation, the base unit 116 records and stores vehicle data (for example, data for complying with Federal Motor Carrier Safety Administration ("FMCSA") regulations), such as vehicle operating parameters monitored by the ECU 112.

The base unit 116 is powered via a connection to a battery (for example, a 12 volt or 24 volt vehicle battery). In some embodiments, the base unit 116 is configured to operate in a fully operational mode and a sleep mode to conserve power. When the base unit 116 is in the fully operational mode, the base unit 116 contains vehicle data received from the ECU 112. For example, data may be obtained by the base unit 116 from the ECU 112 substantially in real-time or at a predefined frequency or interval. When the base unit 116 is communicatively coupled with the portable communication device 120, the base unit 116 may obtain data (for example, data related to positioning information) from the portable communication device 120 substantially in real-time or at a predefined frequency or interval. In one example, the base unit 116 can send data regarding the vehicle 104 and a request for positioning information to the portable communication device 120. In some embodiments, the base unit 116 will use the positioning information it holds or is able to obtain using its internal components unless the positioning information present at the base unit 116 does not meet the desired accuracy or availability requirement. If the positioning information available at the base unit 116 does not meet a particular accuracy and availability requirement, then the base unit 116 uses a location measurement from an external source, for example, one or more of the portable communication devices 120. Thus, certain embodiments provided herein help avoid situations where a driver of a vehicle is required to manually enter or provide a location (for example, by entering a street address) because of inaccurate positioning information at the base unit 116.

Figure 2:
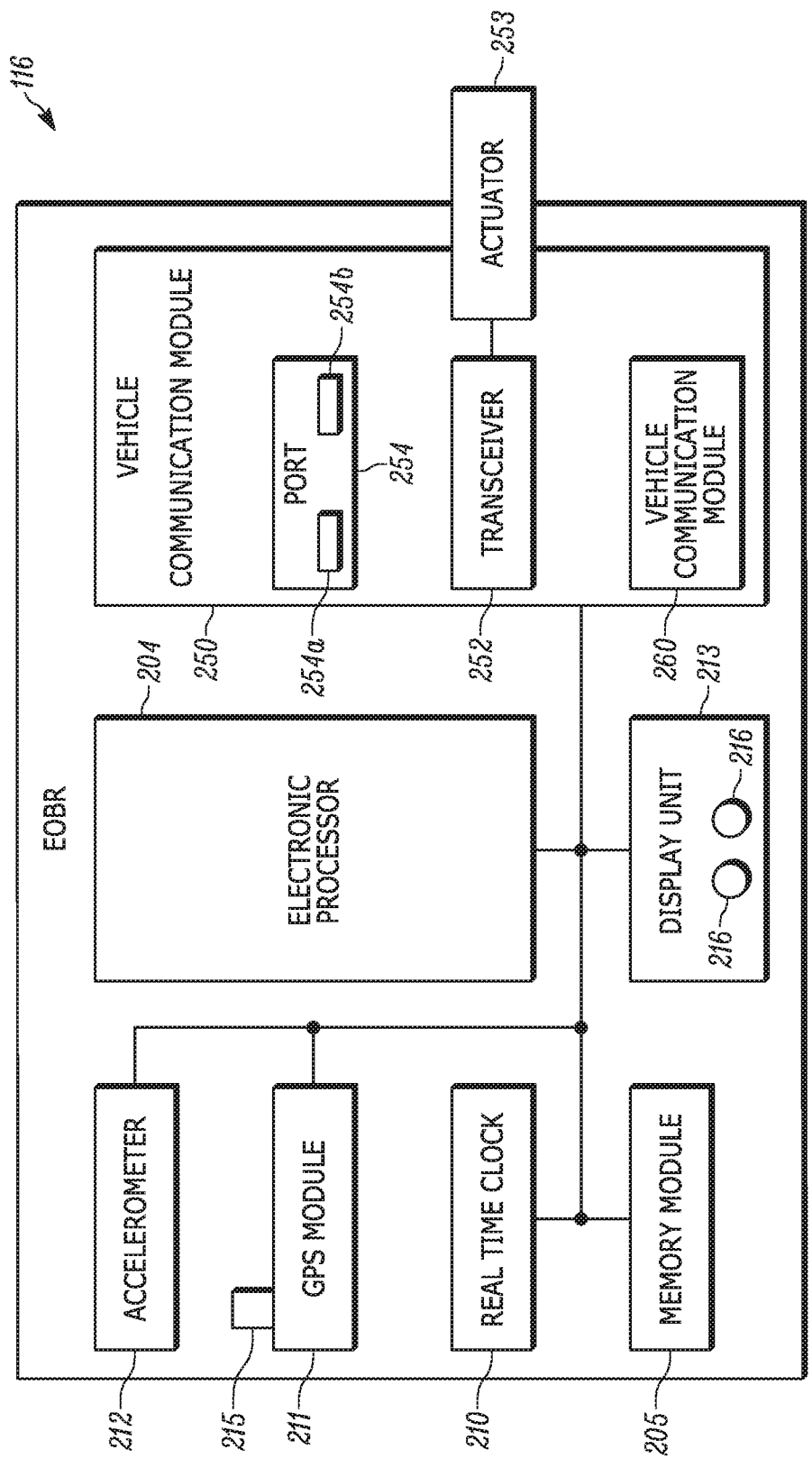
FIG. 2 is a block diagram of a base unit included in the system of FIG. 1 in accordance with some embodiments.

In the example shown in FIG. 2, the base unit 116 includes an electronic processor 204 (such as a microprocessor, controller, or application-specific-integrated circuit ("ASIC") and at least one memory module 205. The memory module 205 includes non-transitory computer readable medium. As described in more detail below, the memory module 205 stores instructions that, when executed by the electronic processor 204, logs vehicle data, logs data retrieval history, and processes data received from the ECU 112 and other devices and systems external to the base unit 116. Accordingly, as described herein, the base unit 116 performs particular functionality by executing instructions with the electronic processor 204.

The base unit 116 also includes a clock 210, a source of positioning information 211, such as global positioning system ("GPS") receiver, an accelerometer 212, and a display unit 213. The clock 210 provides a clock function to allow the base unit 116 to accurately determine a time with a predetermined resolution (for example, approximately one second). The clock 210 is powered by a battery that provides power to the clock 210 even when the vehicle 104 does not provide power to the base unit 116. In some embodiments, the clock 210 is configured to obtain an updated time from the source of positioning information 211.

The source of positioning information 211 includes an antenna 215, which can be internal to the base unit 116. Positioning the antenna 215 internal to the base unit 116 makes the antenna 215 more tamper-proof than if the antenna 215 were positioned external to the base unit 116. Based on data received by the antenna 215 from one or more external satellites 128 (see FIG. 1), the source of positioning information 211 provides positioning information to the electronic processor 204. The positioning information can include coordinates (for example, latitude and longitude coordinates), a speed, a heading, a time, and a quality value. In some embodiments, the source of positioning information 211 updates the positioning information at a predetermined frequency (for example, approximately once per second). The source of positioning information 211 remains active when the vehicle 104 is in motion and whenever the vehicle ignition is "on." When the base unit 116 is in sleep mode, the source of positioning information 211 may be activated periodically after a predetermined period of time. In some embodiments, the base unit 116 may not include a source of positioning information 211, or an accelerometer 212 as described above.

The display unit 213 displays data to a user of the base unit 116. For example, the display unit 213 can include one or more LEDs 216. The LEDs 216 indicate a status of the base unit 116. For example, the LEDs 216 can be used to indicate whether the portable communication device 120 connected to the base unit 116 is properly functioning (for example, a connection status), whether signals are being communicated between the base unit 116 and the ECU 112 (for example, a communication status), and whether signals are being communicated between the base unit 116 and the portable communication device 120 (for example, a mobile communication device communication status). The LEDs 216 can include different colored LEDs and can be configured to flash at different frequencies to signal different statuses of the base unit 116. As an alternative to or in addition to the LEDs 216, the display unit 214 can be configured to provide data to a user through other output mechanisms, such as displaying a textual and/or graphical message, playing an audio sound or message, providing tactile feedback (for example, vibration), or a combination thereof.

The base unit 116 also includes a vehicle communication module 250. As illustrated in FIG. 2, the vehicle communication module 250 includes a transceiver 252 for communicating data between the base unit 116 and the portable communication device 120. The transceiver 252 can communicate with the portable communication device 120 using a wired or wireless connection. For example, as described above, in some embodiments, the base unit 116 communicates with the portable communication device 120 using a Bluetooth connection. Accordingly, the transceiver 252 can include a Bluetooth transceiver. In some embodiments, the transceiver 252 operates simultaneously with the source of positioning information 211.

A Bluetooth-enabled device can be configured to automatically search and discover other Bluetooth-enabled devices. The base unit 116 can include a connection actuator 253 that allows a user to control when the base unit 116 becomes discoverable or searchable. For example, in some embodiments, pressing the connection actuator 253 for a predetermined period of time (for example, three seconds) makes the base unit 116 discoverable by a Bluetooth-enabled portable communication device 120. Also, if the base unit 116 is operating a sleep mode, pressing the connection actuator 253 wakes up the electronic processor 204 and enables communication between the base unit 116 and the portable communication device 120. In some embodiments, the base unit 116 is also configured to automatically become discoverable or searchable for a predefined period of time after the base unit 116 is powered or reset and for a predefined period of time after the base unit 116 enters a sleep mode.

When the base unit 116 is discoverable, the portable communication device 120 can search for, discover, and communicably couple to the base unit 116. In some embodiments, the base unit 116 couples to the portable communication device 120 and functions as a slave unit. Once the portable communication device 120 is communicably coupled to the base unit 116, the display unit 213 of the base unit 116 can indicate a status of the connection or coupling. For example, when the base unit 116 is discoverable or searchable, one or more of the LEDs 216 can flash, and, when the base unit 116 is communicably coupled to the portable communication device 120, the one or more LEDs 216 can provide a solid light. After the portable communication device 120 and the base unit 116 are communicably coupled, the portable communication device 120 and the base unit 116 can exchange data. For example, as described above, the base unit 116 can transmit vehicle data to the portable communication device 120. It should be understood that even when the transceiver 264 is transmitting vehicle data to the portable communication device 120, the base unit 116 continues to monitor and record new vehicle data from the ECU 112 and other devices and systems (for example, the source of positioning information 211, the accelerometer 212, etc.).

As illustrated in FIG. 2, the vehicle communication module 250 also includes a port 254 for physically coupling the portable communication device 120 to the base unit 116. The port 254 allows diagnostic data to be transmitted between the portable communication device 120 and the base unit 116. In some embodiments, the port 254 includes one or more universal serial bus (USB) connections. For example, the port 254 can include a first connection 254*a* and a second connection 254*b*. The first connection 254*a* is used to transmit diagnostic data regarding the base unit 116 to the portable communication device 120 but does not provide a charging current to the portable communication device 120. Therefore, the second connection 254*b* is used to provide a charging current to the portable communication device 120. Therefore, the second connection 254*b* is used to provide a charging current to the portable communication device 120. By providing two separate connections, one for charging and one for data transmission, the base unit 116 does not need to include an isolated DC power supply.

The diagnostic data transmitted through the port 254 can relate to the base unit 116 (as compared to the ECU 112 or other components of the vehicle 104). Therefore, a user can couple the portable communication device 120 to the port 254 to diagnose a malfunction occurring with the base unit 116. Similarly, the port 254 can allow the base unit 116 to be reconfigured, modified, or upgraded using the portable communication device 120. The vehicle communication module 250 also includes a vehicle communication module 250 for communicating with the ECU 112.

Figure 3:
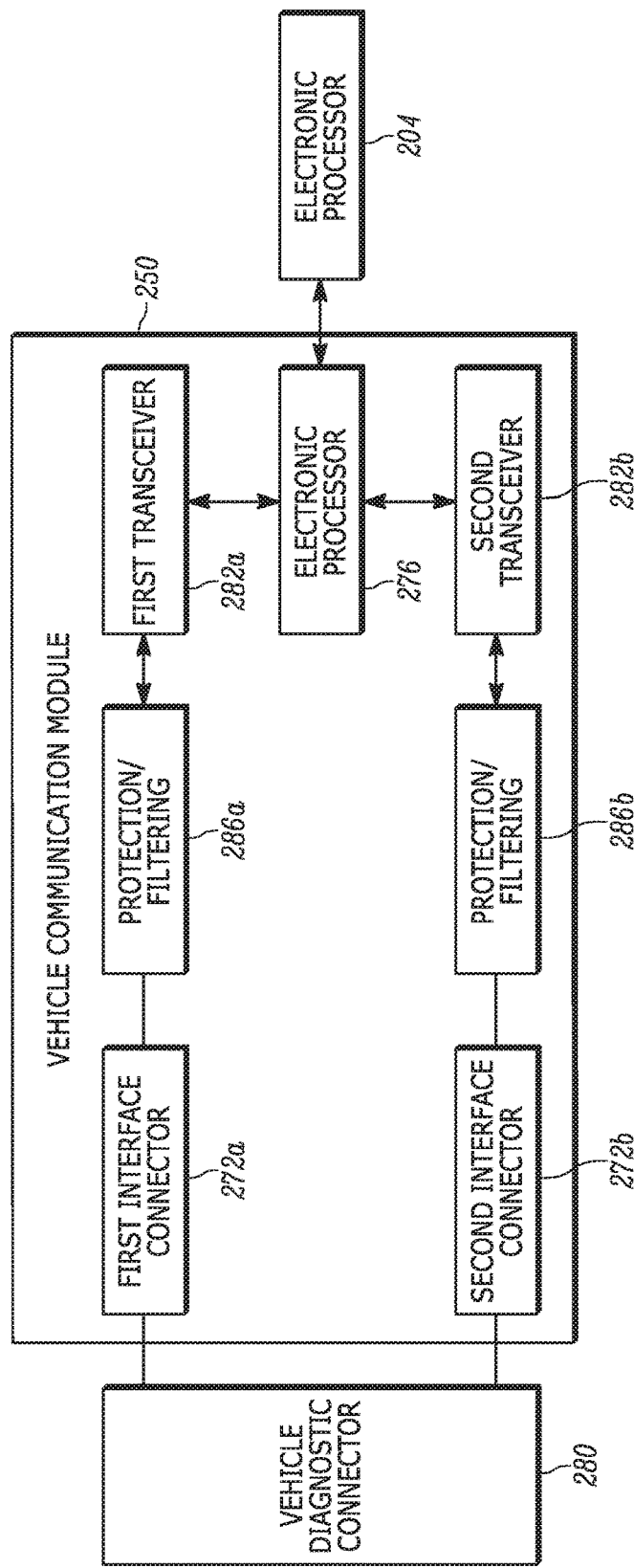
FIG. 3 is block diagram of a vehicle communication module included in the base unit of FIG. 2 in accordance with some embodiments.

As illustrated in FIG. 3, the vehicle communication module 250 includes an electronic processor 276 (such as a microprocessor, controller, or application-specific-integrated circuit ("ASIC") configured to manage communication between the base unit 116 and the ECU 112) and communicates with the electronic processor 204. It should be understood that, in some embodiments, the functionality provided by the electronic processor 276 is performed by the electronic processor 204 (for example, eliminating the need for a separate processing unit in the vehicle communication module 250).

To physically connect with the ECU 112, the base unit 116 includes a plurality of communication interfaces 272 to accommodate various types of vehicle data buses. For example, as described above, the ECU 112 communicates over a data bus 118, which can conform to communication standards such as SAE J1939, SAE J1708, or other standards. In some embodiments, diagnostic data is transmitted over the data bus 118. Therefore, the data bus 118 can be considered an on-board diagnostic ("OBD") bus that includes a diagnostic connector 280 that allows external devices to connect to and exchange data with the data bus 118. Different types of vehicles may include different types of connectors 280 for connecting to the data bus 118. For example, a standard passenger vehicle can include a SAE J1939 interface connector, but a commercial motor vehicle can include a SAE J1708 interface connector.

To accommodate these different connectors 280 (and the underlying different communication standards), the base unit 116 can include a first communication interface 272a for coupling the base unit 116 to a first type of data bus (for example, a SAEJ1939 bus) and a second communication interface 272b for coupling the base unit 116 to a second type of data bus (for example, a SAEJ1708 bus) (see FIG. 3). It should be understood that, in some embodiments, the base unit 116 includes more than two communication interfaces 272. For example, the base unit 116 can include a SJ1708 interface, a SAE J1939 interface, a SAE J1850 Pulse Width Modulation (PWM) interface, a SAE J1850/VP interface, an International Organization for Standardization (ISO) 9141-2 interface, an OBD-II interface, a SAEJ2284 interface, or a combination thereof. The plurality of communication interfaces 272 allows the base unit 116 to communicate with a variety of different vehicle data buses (for example, using a variety of different communication standards) and makes the base unit 116 portable in that the base unit 116 can be removed from a first vehicle and used in second vehicle even if the second vehicle does not include the same type of diagnostic bus or connector available in the first vehicle.

The vehicle communication module 250 also includes at least one transceiver 282 for managing communication via the communication interfaces 272. In some embodiments, the vehicle communication module 250 includes a transceiver 282 for each communication interface 272. For example, as illustrated in FIG. 3, the vehicle communication module 250 can include a first transceiver 282a and a second transceiver 284b. The first transceiver 282a can conform to the communication standard associated with the first communication interface 272a (for example, SAE J1708) and can transmit and receive data through the first communication interface 272a. Similarly, the second transceiver 282b can conform to the communication standard associated with the second communication interface 272b (for example, SAE J1939) and can transmit and receive data through the first communication interface 272a. Similarly, the second transceiver 282b can conform to the communication standard associated with the second communication interface 272b (for example, SAE J1939) and can transmit and receive data through the second communication interface 272b. The transceivers 282 and 284 can be configured to obtain the data from the connector 280 (for example, a vehicle diagnostic connector) individually or simultaneously. It should be understood that in other embodiments, the vehicle communication module 250 includes a transceiver 282 that conforms to more than one communication standard and, therefore, can communicate through more than one of the available communication interfaces 272 (for example, without the need for separate transceivers).

The vehicle communication module 250 can also include one or more protection and filtering modules 286 that filter received data to reduce or eliminate data noise. The protection and filtering modules 286 can also be configured to ensure that received data has a predetermined amplitude range that is acceptable to the electronic processor 276. Thus amplitude surges in data can be detected and the electronic processor 276 can be protected. In some embodiments, as illustrated in FIG. 3, the vehicle communication module 250 includes a protection and filtering module 286 for each transceiver 282 (for example, a first protection and filtering module 286a and a second protection and filtering module 286b). The vehicle communication module 250 can be configured to execute one or more bus identification methods to automatically identify the data bus type(s) available for communicating with the ECU 112.

Figure 4:
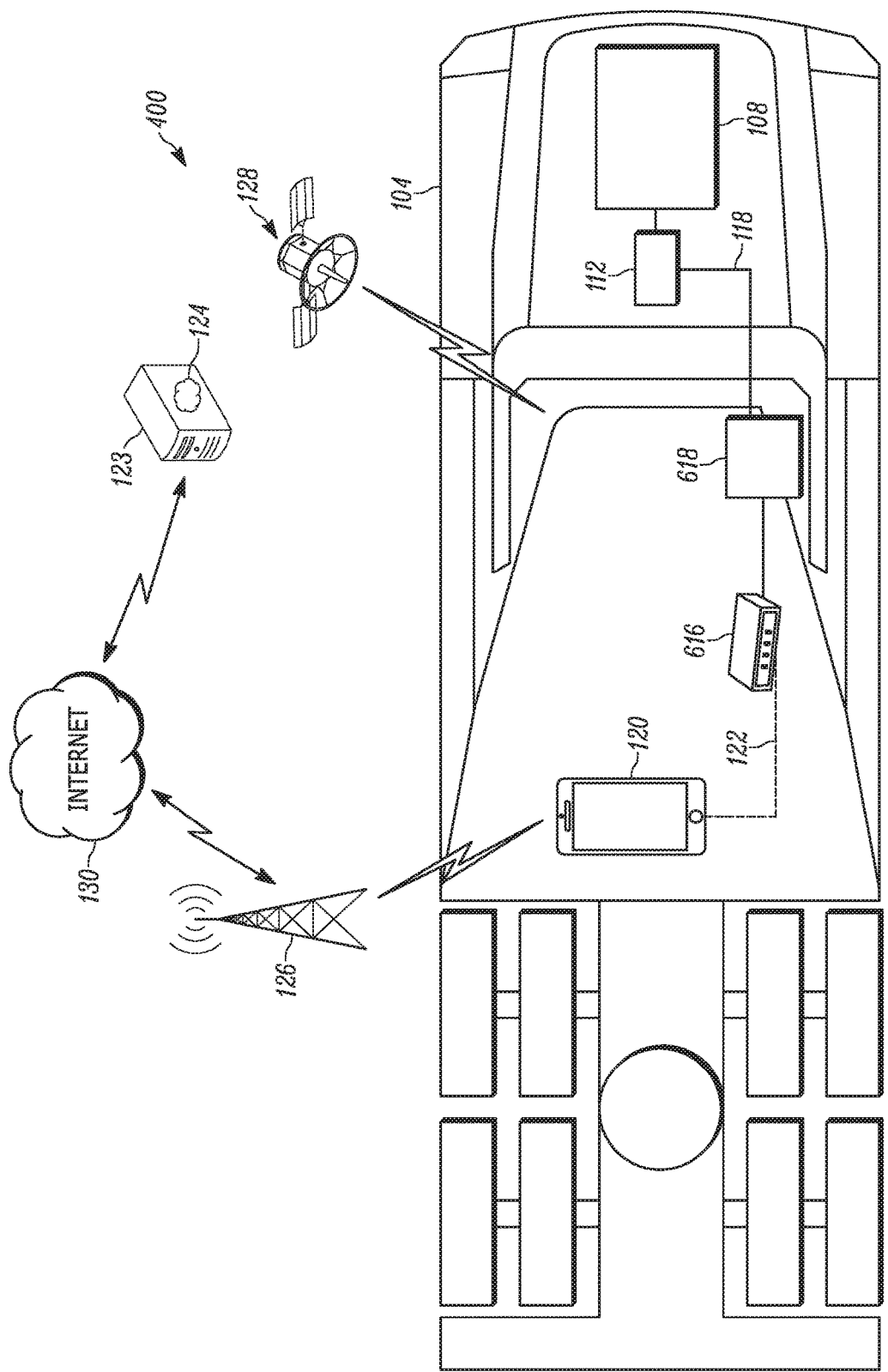
FIG. 4 schematically illustrates a driver performance monitoring system according to another embodiment.

In some embodiments, a vehicle may not be equipped with a base unit 116 as described above or an installed base unit 116 may be malfunctioning. In these situations, an adaptor 516 may be used to capture vehicle data for compliance purposes. For example, FIG. 4 illustrates an alternative performance monitoring system 400 in accordance with one embodiment of the invention. The alternative performance monitoring system 400 includes an adaptor 616, one or more portable communication devices 120 (for example, external to the adaptor 616), and a remote server 123 running a host application 124. The portable communication device 120, remote server 123, and host application 124 can function as described above. However, the adaptor 616 can be used in place of the base unit 116 and, in some embodiments, includes fewer components than the base unit 116.

For example, as illustrated in FIG. 4, the adaptor 616 may be physically coupled to a telematics device 618 included in the vehicle 104 (for example, a navigation device). The telematics device 618 receives positioning information from one or more external satellites 128 and, optionally, communicates with the ECU 112 through a data bus 118 to obtain vehicle data. In some embodiments, the telematics device 618 uses the vehicle data and the positioning information to provide driving related instructions to a driver of the vehicle 104.

Figure 5:
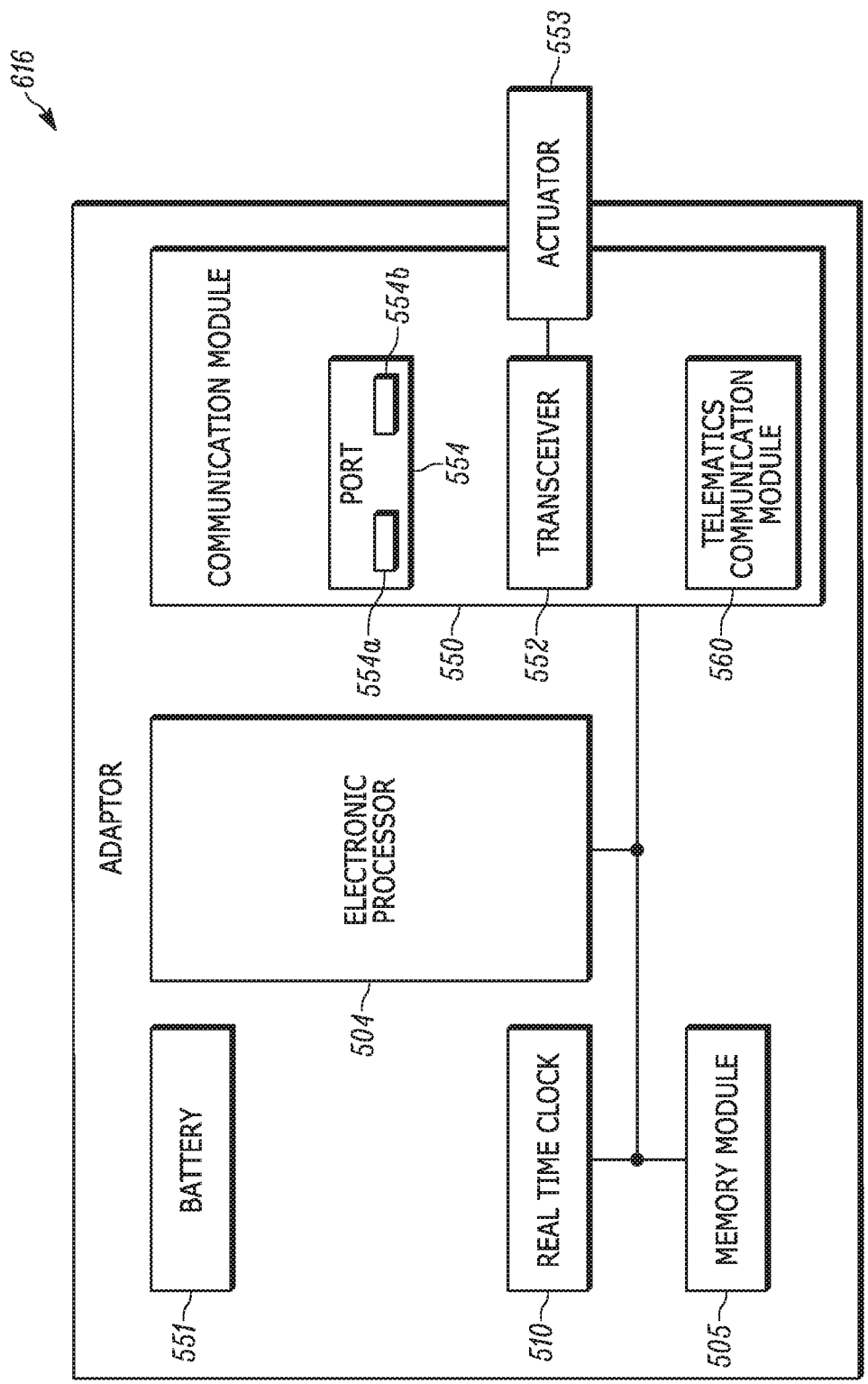
FIG. 5 is a block diagram of an adaptor included in the system of FIG. 6 in accordance with some embodiments.

As illustrated in FIG. 5, in one embodiment, the adaptor 616 includes a processing unit 504 (such as microprocessor, controller or ASIC), at least one memory module 505, a clock 510, and a vehicle communication module 550. In some embodiments, the adaptor 616 also includes a display unit 213, which may include a light emitting diode (LED) that provides a status indication to an operator. In some embodiments, the adaptor 616 does not include a source of positioning information 211, or an accelerometer 212 as described above with respect to the base unit 116.

The processing unit 504 processes vehicle data and positioning information (received from the telematics device 618) to determine and store drive events. As described in more detail below, the adaptor 616 may transmit vehicle data, location, data, drive events, or a combination thereof to the portable communication device 120.

The memory module 505 includes non-transitory computer readable medium, such as a non-volatile serial flash memory and volatile memory. As described above, with respect to the memory module 205 of the base unit 116, the memory module 505 stores instructions that, when executed by the processing unit 504, log vehicle data, log data retrieval history, and process data received from the telematics device 618 and other devices and systems external to the adaptor 616. Accordingly, as described herein, the adaptor 616 performs particular functionality by executing instructions with the processing unit 504.

The clock 510 provides a real-time clock function to allow the adaptor 616 to accurately determine a time with a predetermined resolution (for example, approximately one second). The clock 510 and the other components of the adaptor 616 are powered by the telematics device. Power is received by the adaptor 616 over the physical coupling to the telematics device 618. In some embodiments, the adaptor 616 also includes a battery 551 (for example, a rechargeable battery) for providing power.

In one example, the vehicle communication module 550 of the adaptor 616 may be similar to the vehicle communication module 250 of the base unit 116. As illustrated in FIG. 5 the vehicle communication module 250 includes a transceiver 752 for communicating data between the adaptor 616 and the portable communication device 120 (i.e., external to the adaptor 616). The transceiver 552 may communicate with the portable communication device 120 using a wired or wireless connection. For example, in some embodiments, the adaptor 616 communicates with the portable communication device 120 using a Bluetooth connection provided by a Bluetooth transceiver included in transceiver 552.

In some embodiments, the adaptor 616 may also include a connection actuator 553 (similar to the connection actuator 253 of the base unit 116). When the adaptor 616 is discoverable, the portable communication device 120 may search for, discover, and communicatively couple to the adaptor 616. In some embodiments, the connection actuator 553 includes one or more indicators (for example, LEDs) (not shown) that indicate when the adaptor 616 coupled to the portable communication device 120.

The vehicle communication module 550 may also include a port 554. The port 554 allows the adaptor 616 to be physically coupled to the portable communication device 120. For example, the port 554 may allow diagnostic data to be transmitted between the portable communication device 120 and the adaptor 616. In some embodiments, the port 554 includes one or more serial (for example, USB) connections. For example, the port 554 may include a first serial connection 554a and a second serial connection 554b. The first serial connection 554a is used to receive data from the portable communication device 120 but does not provide a charging current to the adaptor 616. Therefore, the second serial connection 554b is used to provide a charging current to the adaptor 616 (and, ultimately, the battery 551). By providing two separate connections, one for charging and one for data transmission, the adaptor 616 does not need to include an isolated DC power supply.

In one example, the diagnostic data transmitted through the port 554 may be relayed to the adaptor 616. Therefore, a user can couple the portable communication device 120 to the port 554 to diagnose a malfunction occurring with the adaptor 616. Similarly, the port 554 may allow the adaptor 616 to be reconfigured, modified, or upgraded using a portable communication device 120 (for example, by receiving programming instructions from the portable communication device 120). The vehicle communication module 550 also includes a telematics communication module 560 that may include a connector 280 for selectively coupling (for example, attaching and detaching) the adaptor 616 to the telematics device 618. In some embodiments, the connector includes a RS-232 serial connection. In some embodiments, the adaptor 616 may be introduced into the vehicle 104 and connected to the telematics device 618 with minimal or no changes required to the telematics device 618. In other embodiments, firmware may be added to the telematics device 618 to communicate with the adaptor 616. However, the adaptor 616 may provide driver logging capabilities that the telematics device 618 does not provide.

In operation, when the adaptor 616 is coupled to the telematics device 618, the telematics device 618 transmits vehicle data and/or positioning information to the adaptor 616. In some embodiments, the vehicle data transmitted from the telematics device 618 to the adaptor 616 is, for example, a speed of the vehicle 104, revolutions per minute of the engine 108, and an odometer value. In some embodiments, the positioning information transmitted from the telematics device 618 to the adaptor 616 is, for example, GPS coordinates (for example, latitude and longitude coordinates), a directional heading, and a quality value (for example, dilution of precision ("DOP")).

As described above, the adaptor 616 is configured to relay accumulated data to one or more portable communication devices 120. In addition to relaying data received from the telematics device 618 to the portable communication device 120, the adaptor 616 can be configured to process the data received from the telematics device 618, for example, performing time keeping and data logging. For example, in one embodiment, the adaptor 616 records and stores the vehicle data and the positioning information for complying with FMCSA regulations. In particular, the adaptor 616 can be configured to process vehicle and positioning information received from the telematics device 618 to detect a drive event used for driver compliance logging. Once a portable communication device 120 is available, the adaptor 616 transmits the processed data to the portable communication device 120 (for example a detected drive event). It should be understood that even when the transceiver 552 is transmitting vehicle data and positioning information to the portable communication device 120, the adaptor 516 continues to monitor and record new vehicle data and new positioning information from the telematics device 618.

Figure 6:
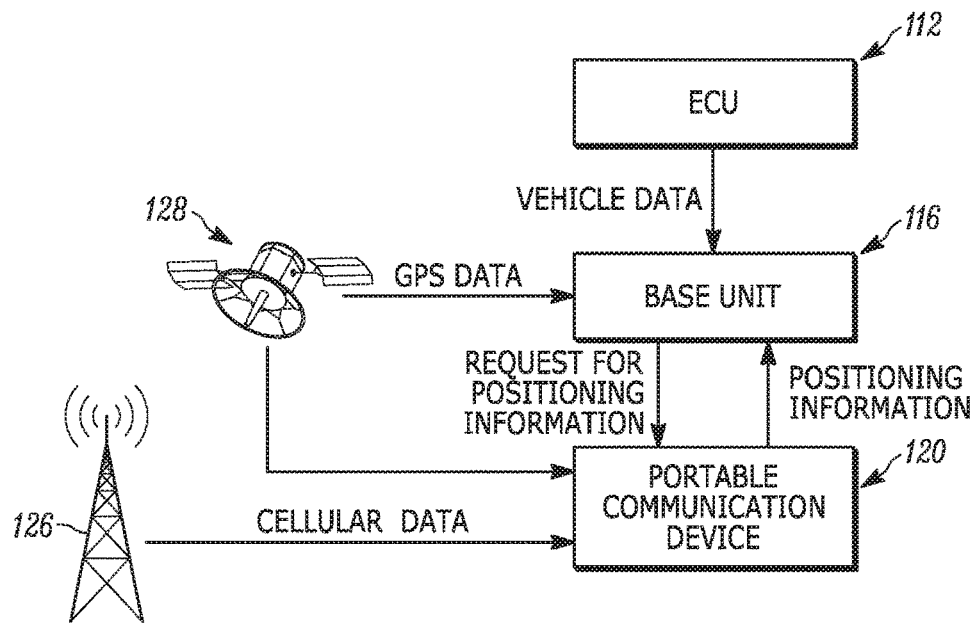
FIG. 6 illustrates data transmission using the driver performance monitoring system of FIG. 1.
Figure 7:
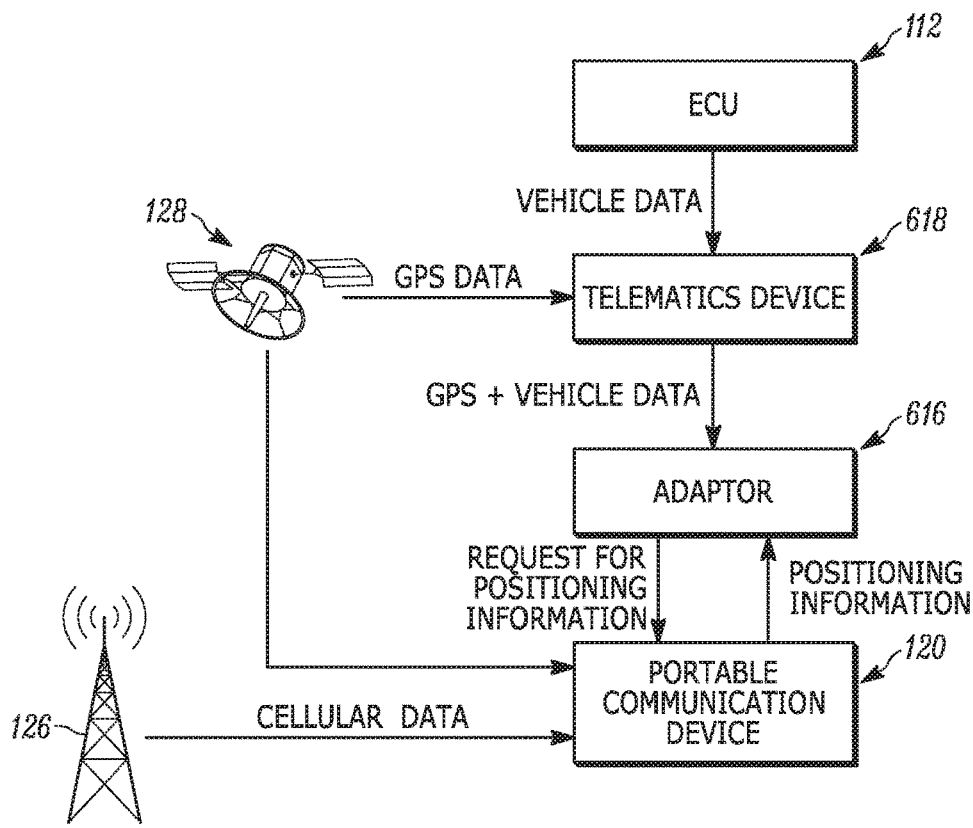
FIG. 7 illustrates data transmission using the driver performance monitoring system of FIG. 4.

FIGS. 6 and 7 illustrate similarities and differences between the data transmission in the performance monitoring system 100 and the alternative performance monitoring system 400 according to some embodiments of the invention. FIG. 6 illustrates data transmission using the performance monitoring system 100 (including the base unit 116), and FIG. 7 illustrates data transmission using the alternative performance monitoring system 400 (including the adaptor 616).

As illustrated in FIG. 6, the base unit 116 receives vehicle data from the ECU 112 of the vehicle 104. Separately, the base unit 116 receives positioning information (for example, GPS data) from one or more external satellites 128. In some embodiments, the location data consists of GPS coordinates (for example, latitude and longitude coordinates), a time, a quality value, and an odometer value. In some embodiments, the base unit 116 records and processes the received vehicle and positioning information and transmits the data to the portable communication device 120. In one example, the base unit 116 determines whether the received positioning information meets or exceeds predetermined thresholds of accuracy and availability. If the base unit 116 determines that the received positioning information from the source of positioning information 211 exceeds certain predetermined thresholds of accuracy and availability then the base unit 116 sends a request to the portable communication device 120 for additional positioning information. In response to the request for positioning information, the portable communication device 120 returns positioning information received from at least one of the external satellites 128 or cellular data from cellular tower 126. Often the global positioning system (GPS) antenna associated with the portable communication device 120 is located in a better location to receive GPS satellite data compared to the GPS antenna located in the base unit 116, which is typically located near the in-cab diagnostic port.

As illustrated in FIG. 7, the telematics device 618 receives vehicle data from the ECU 112 and receives location (for example, GPS) data from the external satellites 128. The telematics device 618 transmits the vehicle and location data to the adaptor 616. In some embodiments, similar to the base unit 116, the adaptor 616 records and processes received data. In some embodiments, the adaptor 616 also transmits the data to the portable communication device 120. If the adaptor 616 determines that the received positioning information from the telematics device 618 exceeds certain predetermined thresholds of accuracy and availability then the adaptor 616 sends a request to the portable communication device 120 for additional positioning information. In response to the request for positioning information, the portable communication device 120 returns positioning information received from at least one of the external satellites 128 or cellular data from cellular tower 126.

Figure 8:
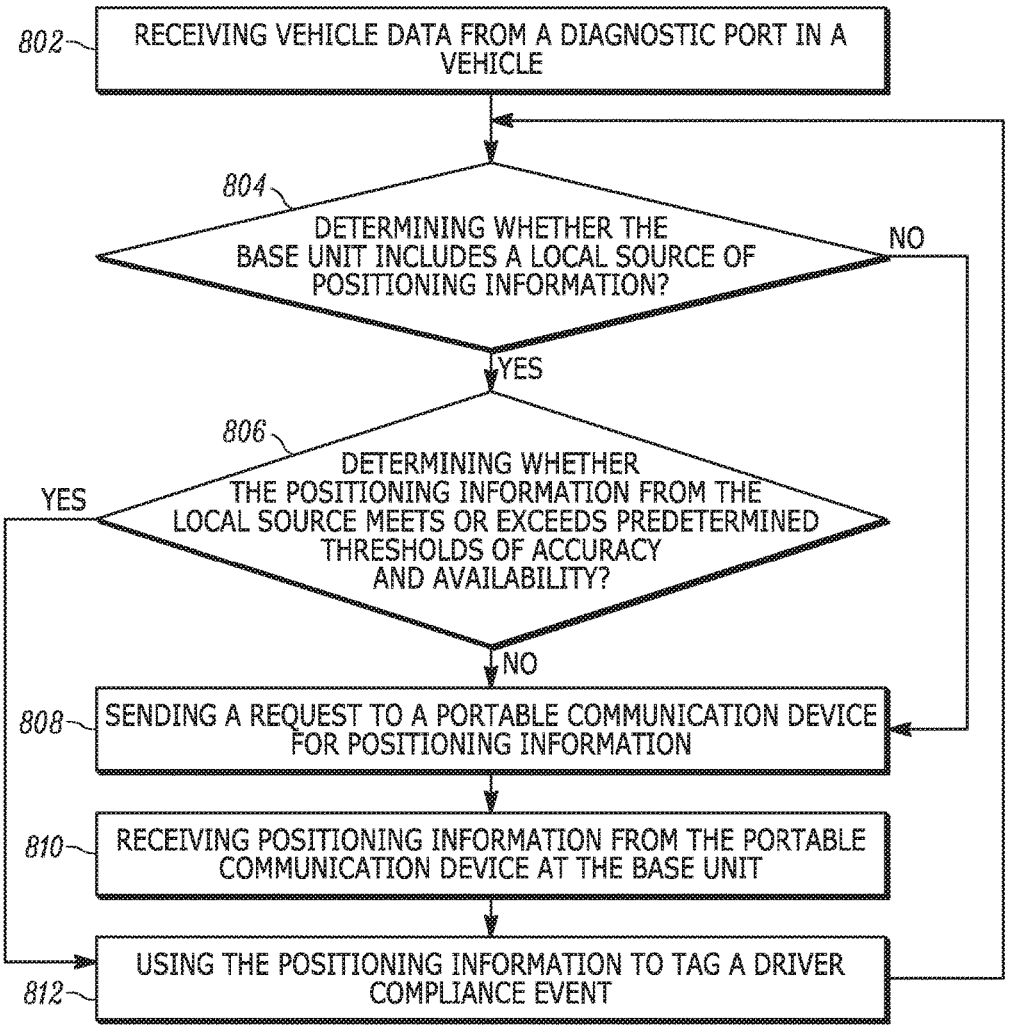
FIG. 8 is a flowchart illustrating a method of determining positioning information for driver compliance in accordance with some embodiments.

FIG. 8 is a flowchart illustrating a method of determining positioning information for driver compliance in accordance with some embodiments. At block 802, the method includes receiving, with an electronic processor, vehicle data from a diagnostic port in a vehicle (for example, a vehicle diagnostic connector 280). In some embodiments, the vehicle data includes speed, hours of vehicle or engine operation, operating status, ignition state, trip distance and total vehicle distance. The base unit 116 can be configured to detect drive events based on collected vehicle data. A drive event includes, for example, a "drive-on" event, a "drive-off" event, a "stop" event, a "move" event and an "ignition-on" event. A "drove-on" event occurs after the vehicle 104 travels a predetermined distance (for example, 0.5 miles) after a "move" event or after the vehicle 104 reaches a predetermined speed (for example, 5 miles per hour) after a "move" event. Similarly, a "drive-off" event occurs when the driver stops operating the vehicle 104 (for example, ends a current trip). In some embodiments, the collection device uses a state machine to detect a drive event. Upon detecting the event, the base unit 116 stores the event. Stored events can also include operating events of the base unit 116, including a reset event representing a reset (for example, manual or otherwise) of the base unit 116. When the base unit 116 is communicatively coupled to a portable communication device 120, the base unit 116 is configured to transmit a stored event to the portable communication device 120.

At block 804, the method includes determining whether the base unit 116 includes a local source of positioning information (for example, a source of positioning information 211). If there is no local source of positioning information then method proceeds to block 808. However, at block 804, if it is determined that there is a local source of positioning information, then the method proceeds to block 806.

At block 806, the method includes determining whether the positioning information from the local source meets or exceeds predetermined thresholds of accuracy and availability. If the method determines that the positioning information from the local source meets or exceeds the predetermined thresholds of accuracy and availability, then the method proceeds to block 812. However, at block 806, if it is determined that the positioning data from the local source does not meet the predetermined thresholds of accuracy and availability, then the method proceeds to block 808. In one example, the base unit 116 (or the adaptor 616) identifies a first (for example, in time) instance of stored positioning data that occurred during the time period associated with the request (at block 808). After identifying the first instance, the base unit 116 (or the adaptor 616) uses a quality value included in the identified positioning data to determine a reliability of the identified positioning data. Depending on the method used to acquire the positioning data (for example, by the source of positioning information 211 or the telematics device 618), the degree of reliability of the location data may be different. For example, the source of positioning information typically provides a quality value that designates how the GPS coordinates were obtained. In general, the lower the quality value, the lower the quality of the associated coordinates. For example, if the source of positioning information 211 receives an invalid positioning data or receives no information, the quality value can be set to zero, but if the source of positioning information 211 in the base unit 116 uses a GPS or a standard position service ("SPS") to obtain location data, the GPS quality value may be set to one. Similarly, if the source of positioning information 211 uses differential GPS ("DGPS"), the quality value may be set to two, and if the source of positioning information 211 uses a precise positioning service ("PPS"), the quality value may be set to three. As noted above, positioning data includes not only the GPS coordinates by also a quality value. Accordingly, the base unit 116 (or the adaptor 616) can be configured to compare a quality value of a stored location to the position reliability threshold to determine whether the positioning data is sufficiently reliable.

In addition, if the positioning data is not sufficiently reliable based on the quality value, the base unit 116 (or the adaptor 616) determines a mileage uncertainty value for the location equal to the distance between the positioning data and the last positioning data associated with a GPS fix (i.e., the last set of positioning data generated when GPS signals were being received). The base unit 116 compares the mileage uncertainty value associated with the positioning data to the mileage uncertainty threshold. If the mileage uncertainty value associated with the positioning data exceeds the maximum uncertainty distance value associated with the threshold, the base unit 116 does not add the positioning data to the set. Thus the base unit 116 may use the mileage uncertainty value to add positioning data to the set that otherwise may not be added (for example, due to reliability issues) to provide additional positioning data details when exact positions or mileage are not available. However, the base unit 116 only adds the positioning data when the positioning data represents the distance from the last GPS fix within a predetermined distance (for example, a mileage uncertainty threshold). For example, if the mileage identity threshold is 5 miles, the base unit 116 adds the positioning information data to the set if the uncertainty value (i.e., distance between the instance of location data currently being evaluated and the last GPS fix) is less than or equal to 5 miles. If the mileage uncertainty value is greater than 5 miles, the positioning data is not added to the set (for example, because the positioning data was generated too far from the last GPS fix).

At block 808, the method includes sending a request to a portable communication device 120 for positioning information. The method then proceeds to block 810. At block 810, the method includes receiving additional positioning information from the portable communication device at the base unit 116. The method then proceeds to block 812. At block 812, the method includes using the positioning information to tag a driver compliance event. The method continues back to block 804 to repeat the process again.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus for determining positioning information of a vehicle operated by a driver for driver compliance, the apparatus comprising:
   a connector for physically coupling the apparatus to a diagnostic port in the vehicle;
   an electronic control unit connected to the connector and configured to receive vehicle data;
   a transceiver for communicating with a portable communication device; and
   an electronic processor connected to the electronic control unit and to the transceiver and configured to
   receive the vehicle data from the electronic control unit,
   determine whether the apparatus includes a local source of positioning information,
   in response to determining that the apparatus includes the local source of positioning information, determine whether a positioning information from the local source of positioning information meets or exceeds an accuracy threshold and an availability threshold, and
   in response to determining that the apparatus does not include the local source of positioning information, or the positioning information from the local source of positioning information not meeting or exceeding the accuracy threshold, the availability threshold, or both, send a request to the portable communication device for additional positioning information.

2. The apparatus of claim 1, wherein the electronic processor is further configured to periodically receive the additional positioning information from the portable communication device.

3. The apparatus of claim 1, wherein the portable communication device is selected from the group consisting of a smart phone, a smart watch, a tablet computer and a laptop computer.

4. The apparatus of claim 1, wherein the additional positioning information is used to tag a driver compliance event.

5. The apparatus of claim 1 further comprising an adaptor including the electronic processor.

6. The apparatus of claim 1, wherein the accuracy threshold includes an accuracy of an absolute position of the vehicle within a range of 0.5 miles.

7. The apparatus of claim 1, wherein the availability threshold includes an availability of data associated with the vehicle once for every 5 miles of driving.

8. A method for determining positioning information of a vehicle operated by a driver for driver compliance, the method comprising:
  receiving, with an electronic processor, vehicle data from a diagnostic port in a vehicle;
  determining, with the electronic processor, whether a base unit includes a local source of positioning information;
  in response to the base unit including the local source of positioning information, determining whether a positioning information from the local source of positioning information meets or exceeds an accuracy threshold and an availability threshold; and
  in response to the base unit not including the local source of positioning information, or the positioning information from the local source of positioning information not meeting or exceeding the accuracy threshold, the availability threshold, or both, sending a request to a portable communication device for additional positioning information.

9. The method of claim 8 further comprising:
  using the additional positioning information to tag a driver compliance event.

10. The method of claim 8 further comprising:
  receiving, with the electronic processor, the additional positioning information from the portable communication device.

11. The method of claim 10, wherein receiving positioning information from the portable communication device includes receiving the positioning information periodically from the portable communication device.

12. The method of claim 10, wherein receiving the additional positioning information from the portable communication device includes receiving the additional positioning information from the portable communication device selected from a group consisting of a smart phone, a smart watch, a tablet computer and a laptop computer.

13. The method of claim 8, wherein determining the positioning information from the local source of positioning information meets or exceeds the accuracy threshold includes determining an accuracy of an absolute position of the vehicle within a range of 0.5 miles.

14. The method of claim 8, wherein determining the positioning information from the local source of positioning information meets or exceeds the availability threshold includes determining the availability of vehicle data once for every 5 miles of driving.

15. An apparatus for determining positioning information of a vehicle for driver compliance, the apparatus comprising:
  a connector for physically coupling the apparatus to a diagnostic port in the vehicle;
  a transceiver for communicating with a portable communication device; and
  an electronic processor configured to connect to an electronic control unit of the vehicle and to the transceiver and configured to
  receive vehicle data from the electronic control unit,
  determine whether the apparatus includes a local source of positioning information,
  in response to determining that the apparatus includes the local source of positioning information, determine whether a positioning information from the local source of positioning information meets or exceeds an accuracy threshold and an availability threshold; and
  in response to determining that the apparatus does not include the local source of positioning information, or the positioning information from the local source of positioning information not meeting or exceeding the accuracy threshold, the availability threshold, or both, send a request to the portable communication device for additional positioning information.

* * * * *